(12) United States Patent
Hsu

(10) Patent No.: US 12,048,111 B2
(45) Date of Patent: Jul. 23, 2024

(54) ELECTRONIC DEVICE, WITHDRAWAL METHOD FOR REPLACEABLE MODULE THEREOF AND SLIDING FASTENER THEREOF

(71) Applicant: GETAC TECHNOLOGY CORPORATION, New Taipei (TW)

(72) Inventor: Wan-Lin Hsu, Taipei (TW)

(73) Assignee: Getac Technology Corporation, New Taipei (TW)

(*) Notice: Subject to any disclaimer, the term of this patent is extended or adjusted under 35 U.S.C. 154(b) by 18 days.

(21) Appl. No.: 18/095,477

(22) Filed: Jan. 10, 2023

(65) Prior Publication Data
US 2023/0240031 A1    Jul. 27, 2023

Related U.S. Application Data

(63) Continuation of application No. 17/586,632, filed on Jan. 27, 2022, now Pat. No. 11,612,073.

(51) Int. Cl.
*H05K 7/14* (2006.01)
*H05K 5/02* (2006.01)

(52) U.S. Cl.
CPC ......... *H05K 5/0286* (2013.01); *H05K 7/1461* (2013.01)

(58) Field of Classification Search
CPC .............. H05K 5/0286; H05K 7/1461

USPC ................................... 361/801, 803
See application file for complete search history.

(56) References Cited

U.S. PATENT DOCUMENTS

| | | | | |
|---|---|---|---|---|
| 6,285,557 B1* | 9/2001 | Tomioka | ............... | H05K 5/0295 361/801 |
| 8,220,756 B2* | 7/2012 | Peng | ..................... | G11B 33/128 248/200.1 |
| 8,297,574 B2* | 10/2012 | Zhang | .................. | G11B 33/124 361/679.02 |
| 9,886,069 B2* | 2/2018 | Moore | ..................... | G06F 1/187 |
| 11,406,031 B2* | 8/2022 | Yu | ......................... | G06F 1/1679 |
| 11,612,073 B1* | 3/2023 | Hsu | ....................... | H05K 5/0286 |
| 2011/0095153 A1* | 4/2011 | Zhang | .................. | G11B 33/124 248/309.1 |
| 2016/0360636 A1* | 12/2016 | Magnoux | ............. | H05K 7/1461 |

* cited by examiner

*Primary Examiner* — Anthony Q Edwards
*Assistant Examiner* — Hung Q Dang
(74) *Attorney, Agent, or Firm* — Cooper Legal Group, LLC

(57) ABSTRACT

The present invention provides an electronic device including a replaceable module and a sliding fastener. The replaceable module is provided with a first sliding track. The sliding fastener includes a body having a latch extending therefrom the body and a groove so as to form a handle. The body is provided with a second sliding track corresponding to the first sliding track, and the handle is elastically bendable along the groove so as to flex relative to the body and disengage from the replaceable module.

12 Claims, 14 Drawing Sheets

ELECTRONIC DEVICE, WITHDRAWAL METHOD FOR REPLACEABLE MODULE THEREOF AND SLIDING FASTENER THEREOF

This application is a continuation of U.S. application Ser. No. 17/586,632, filed Jan. 27, 2022, the entire disclosure of which is hereby incorporated by reference.

FIELD OF THE INVENTION

The present invention relates to an electronic device and, more particularly, to an electronic device in which a replaceable module having a bendable handle is formed on a sliding fastener provided on the replaceable module.

DESCRIPTION OF THE PRIOR ART

A common electronic device such as a laptop computer or a tablet computer is usually flat in shape, and a replaceable module that can be replaced is often provided on the electronic device. The replaceable module is usually a battery, a hard drive or other function modules. The replaceable module is usually flat in shape, and is common installed by two means—one is being embedded in a bottom surface of the electronic device, and the other is being inserted into the electronic device from a side opening of the electronic device. The replaceable module is less easily withdrawn if installed by the means of being inserted from the side, and so a pull strap is needed on the replaceable module to allow pulling operation by a user. The pull strap is generally made of a fabric and has one end thereof fixed at the replaceable module, and such fabric pull strap is likely damaged or fallen off and cannot be readily stored or secured due to its irregular shape. Moreover, if the fabric pull strap is clamped by an opening lid, malfunction of waterproofness of the lid may be caused.

In view of the above, on the basis of extensive development with the practice of theories, the inventor has provided an invention with a reasonable design and effectively improving the issues above in the aim of improving and resolving the above issues above.

SUMMARY OF THE INVENTION

The present invention provides an electronic device including a replaceable module and a sliding fastener, wherein a bendable handle is formed on the sliding fastener.

The present invention further provides an electronic device including a replaceable module and a sliding fastener. The replaceable module is provided with a first sliding track on one side thereof. The sliding fastener includes a body, which is provided with a second sliding track that is connected to the first sliding track. The body is provided with a latch, a handle is extended from the body, and a groove is traversely disposed at a joint between the body and the handle. The sliding fastener is elastically bendable along the groove, such that the handle is enabled to turn along the groove relative to the body so as to be adhered to or erected on a surface of the replaceable module.

In the electronic device of the present invention, the sliding fastener includes a buckle, and the replaceable module is provided with a fastening seat. When the handle is adhered to the surface of the replaceable module, the buckle is fastened with the fastening seat. The sliding fastener is provided with a pair of stroke blocks, and the replaceable module is provided with a positioning tongue corresponding to the pair of stroke blocks. The sliding fastener is movable along the first sliding track relative to the replaceable module, and at the same time the positioning tongue is movable between the pair of stroke blocks so as to limit the movable stroke of the sliding fastener.

The electronic device of the present invention further includes a host body, which is provided with an accommodation chamber. The replaceable module is accommodated in the accommodation chamber. The sliding fastener is movable along the first sliding track relative to the replaceable module to insert the latch into the host body.

The present invention further provides a withdrawal method for a replaceable module. The withdrawal method includes: providing a replaceable module, which is provided with a first sliding track on one side thereof; providing a sliding fastener, wherein the sliding fastener includes a body, the body is provided with a second sliding track that is connected to the first sliding track, the body is provided with a latch, a handle is extended from the body, a groove is traversely disposed at a joint between the body and the handle, and the sliding fastener is elastically bendable along the groove to enable the handle to turn along the groove relative to the body; and connecting the second sliding track to the first sliding track, such that the handle is enabled to turn along the groove so as to be adhered to or erected on a surface of the replaceable module.

In the withdrawal method for a replaceable module of the present invention, the replaceable module is accommodated in a host body, and the sliding fastener is movable along the first sliding track relative to the replaceable module to insert the latch into the host body.

In the withdrawal method for a replaceable module of the present invention, the replaceable module is accommodated in a host body, and the method further includes erecting the handle on the surface of the replaceable module and pulling the handle to move the replaceable module out of the host body.

The withdrawal method for a replaceable module of the present invention further includes erecting the handle on the surface of the replaceable module, and pulling the handle along a longitudinal direction of the handle to drag and move the replaceable module.

The withdrawal method for a replaceable module of the present invention further includes erecting the handle on the surface of the replaceable module, and pulling the handle in a direction parallel to the first sliding track to push and move the sliding fastener along the first sliding track.

In the withdrawal method for a replaceable module of the present invention, the sliding fastener includes a buckle, the replaceable module is provided with a fastening seat, and the method further includes adhering the handle to the surface of the replaceable module, and fastening the buckle with the fastening seat so as to fix the handle to the surface of the replaceable module.

In the withdrawal method for a replaceable module of the present invention, the sliding fastener is provided with a pair of stroke blocks, the replaceable module is provided with a positioning tongue corresponding to the stroke blocks, and the method further includes, after the connecting of the second sliding track to the first sliding track, pushing the sliding fastener along the first sliding track to move the positioning tongue to a position between the stroke blocks so as to limit a movable stroke of the sliding fastener.

In the withdrawal method for a replaceable module of the present invention, one of the stroke blocks is a rib, and the positioning tongue crosses over the rib and moves to a position between the stroke blocks.

The present invention further provides an electronic device including a replaceable module and a sliding fastener. The replaceable module is provided with a first sliding track. The sliding fastener includes a body, a latch is extended from the body and a groove is provided to form a handle, and the body is provided with a second sliding track corresponding to the first sliding track. The handle is elastically bendable along the groove so as to flex relative to the body and disengage from the replaceable module.

The electronic device of the present invention further includes a host body. The host body is provided with an accommodation chamber and a latch slot. A direction in which the replaceable module is inserted into the accommodation chamber is perpendicular to a direction in which the latch is inserted into the latch slot. The accommodation chamber has an opening, and the replaceable module enters the accommodation chamber through the opening. A positioning latch is protrudingly provided on the other side of the body, and a corresponding passage is provided on one side of the opening. The positioning latch interferes with an inner edge of the opening, the passage is connected with the opening, and an extension direction of the passage is parallel to the direction in which the replaceable module is inserted into the accommodation chamber. When the positioning latch is aligned with the passage, the positioning latch is capable of inserting into the passage to allow the replaceable module to be completely inserted into the accommodation chamber. The host body is provided with an auxiliary latch slot connected with the passage, and the auxiliary latch slot extends in parallel to the inner edge of the opening. Once the replaceable module is inserted into the accommodation chamber, the latch and the positioning latch can be respectively latched into the latch slot and the auxiliary latch slot by moving the sliding fastener along the first sliding track.

The present invention further provides a sliding fastener including a body. A latch is extended from the body, and a groove is provided to form a handle. The handle is elastically bendable along the groove so as to flex relative to the body.

The sliding fastener of the present invention further includes a pair of stroke blocks. One of the stroke blocks is a rib. The handle is provided with a buckle.

In conclusion, in the electronic device of the present invention, the sliding fastener is provided on the replaceable module thereof to form a replaceable module having a bendable handle. Thus, the handle may be bent and turned so as to be erected on an operating surface of the replaceable module for a user to pull the replaceable module out of the electronic device. Moreover, the handle is formed at the sliding fastener and is thus easily stored ad secured.

DETAILED DESCRIPTION OF THE EMBODIMENTS

Figure 1:
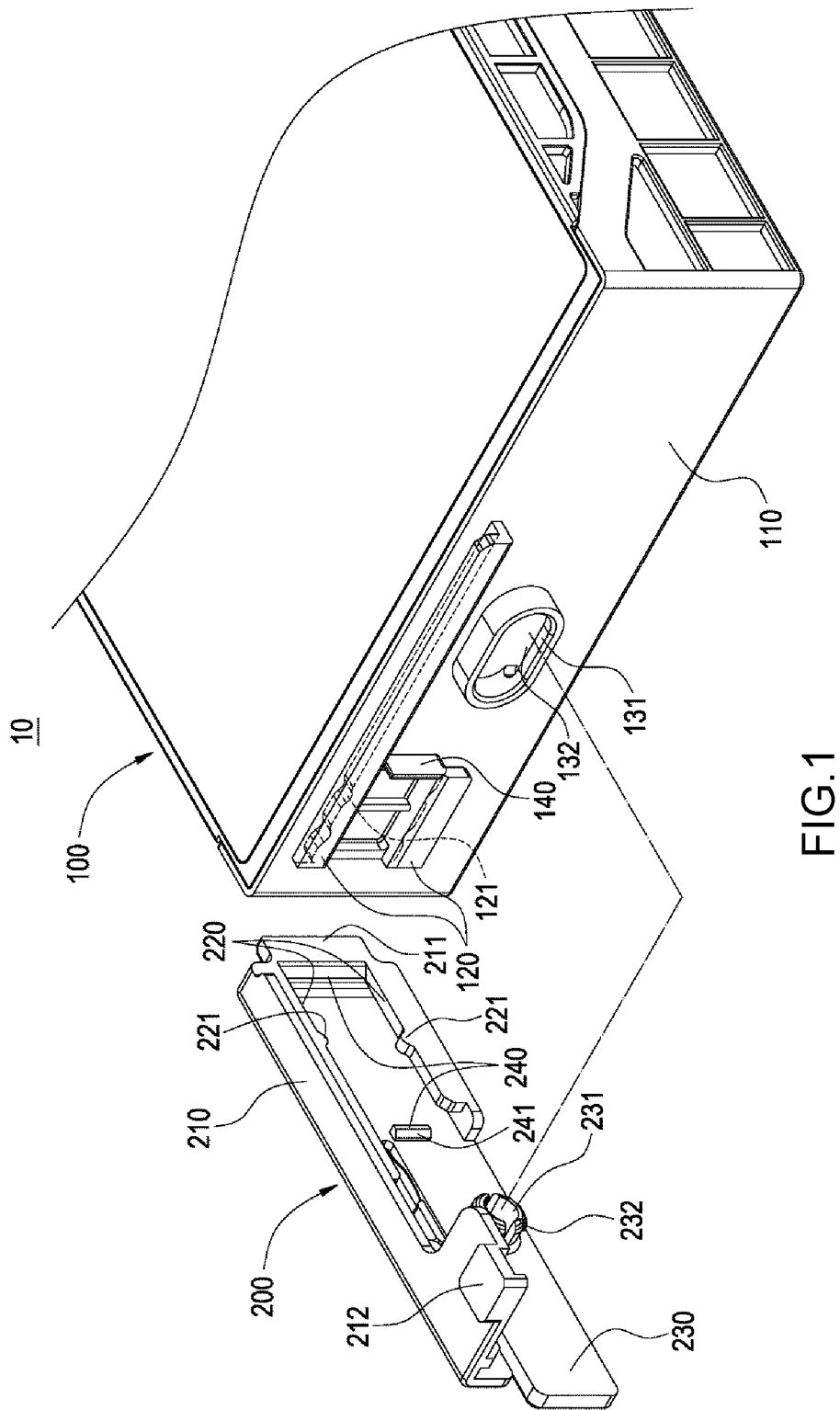
FIG. 1 is a three-dimensional exploded schematic diagram of a replaceable module and a sliding fastener of an electronic device of the present invention.
Figure 2:
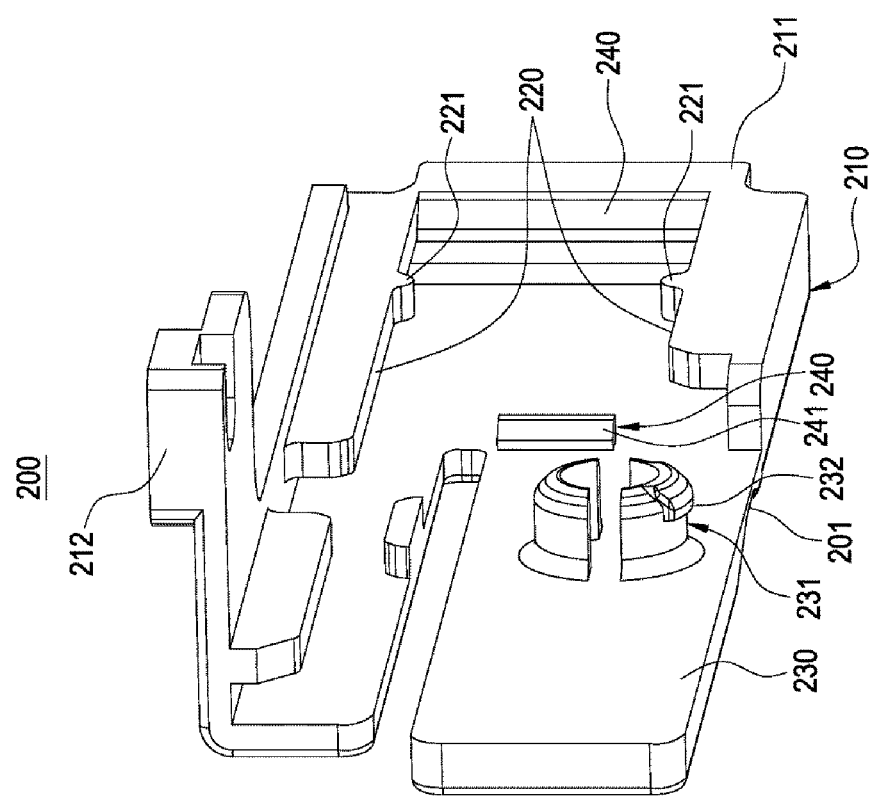
FIG. 2 is a three-dimensional schematic diagram of a sliding fastener of an electronic device of the present invention.
Figure 3:
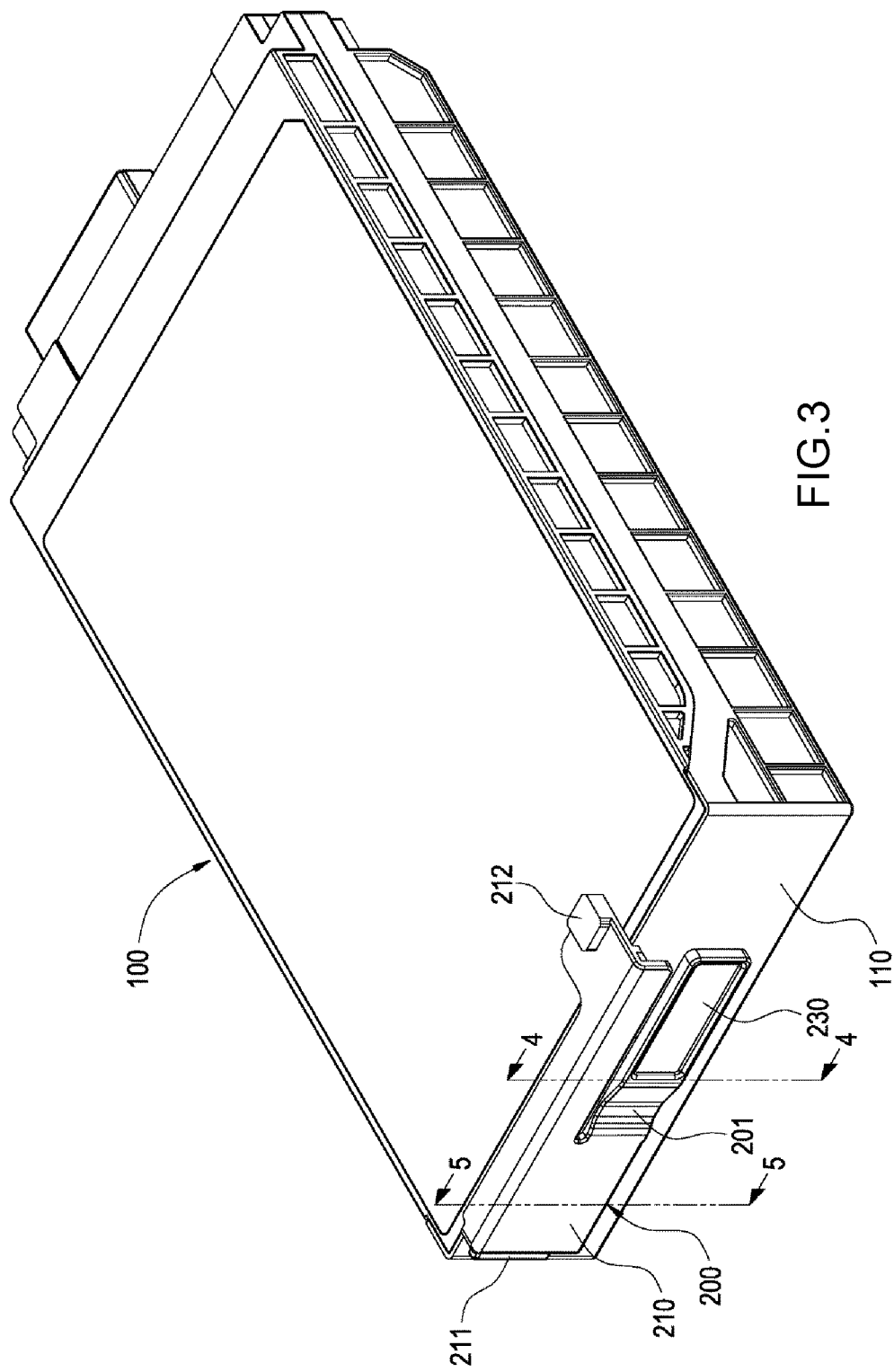
FIG. 3 is a three-dimensional schematic diagram of a replaceable module and a sliding fastener of an electronic device of the present invention.

Referring to FIG. 1 to FIG. 3, an electronic device 10 provided by an embodiment of the present invention at least includes a replaceable module 100 and a sliding fastener 200. Moreover, in this embodiment, the electronic device 10 further includes a host body 300.

In this embodiment, the host body 300 is a flat-shaped cuboid, an accommodation chamber 310 is enclosed inside the host body 300, one of the sides of the host body 300 is provided with an opening 311, and the opening 311 is connected with the accommodation chamber 310. A latch slot 320 is provided on an inner edge of one side of the opening 311. The opening 311 may be covered by a lid (not shown) so as to close the accommodation chamber 310.

The shape of the replaceable module 100 matches the accommodation chamber 310 and can thus be placed into the accommodation chamber 310 through the opening 311. In this embodiment, the replaceable module 100 may be a battery, and is, for example but not limited to, a flat-shaped cuboid. A first sliding track 120 is provided on one side of the replaceable module 100. More specifically, one of the sides of the replaceable module 100 forms an operating surface 110. When the replaceable module 100 is accommodated in the accommodation chamber 310, the operating surface 110 is located in the opening 311. The first sliding track 120 is disposed on the operating surface 110 or is arranged along an outer edge of the operating surface 110.

The sliding fastener 200 includes a body 210, which is provided with a second sliding track 220. The second sliding track 220 is connected to the first sliding track 120, and is movably disposed on the operating surface 110 of the replaceable module 100. A latch 211 and a handle 230 are extended from the body 210, and the latch 211 is arranged toward the latch slot 320. When the replaceable module 100 is accommodated in the accommodation chamber 310, the sliding fastener 200 is movable along the first sliding track 120 relative to the replaceable module 100, so as to insert the latch 211 into the latch slot 320 of the host body 300. Moreover, a direction in which the replaceable module 100 is inserted into the accommodation chamber 310 is perpendicular to a direction in which the latch 211 is inserted into the latch slot 320, thereby locking the replaceable module 100 in the accommodation chamber 310 to prevent disengagement.

In this embodiment, the latch 211 and the handle 230 preferably extend in a back-to-back manner; however, the present invention is not limited thereto. A groove 201 is traversely disposed at a joint between the body 210 and the handle 230, and the handle 230 is elastically bendable along the groove 201 so as to flex relative to the body 210 and disengage from the replaceable module 100. That is to say, the sliding fastener 200 is elastically bendable along the groove 201, such that the handle 230 is enabled to turn along the groove 201 relative to the body 210 so as to be adhered to or erected on the operating surface 110 of the replaceable module 100.

The sliding fastener 200 includes a buckle 231, and the replaceable module 100 is provided with a corresponding fastening seat 131. More specifically, the buckle 231 is disposed on the handle 230, and the fastening seat 131 is disposed on the operating surface 110. When the handle 230 is adhered to the operating surface 110 of the replaceable module 100, the buckle 231 is fastened with the fastening seat 131 so as to be able to fix the handle 230. In this embodiment, the buckle 231 is a column, and a second fastening portion 232 shaped as an inverted hook is protrudingly provided on a side surface thereof. The fastening seat 131 appears as a long channel, an extension direction of the fastening seat 131 is parallel to the first sliding track 120, a channel-shaped first fastening portion 132 is provided on one side inside the fastening seat 131, and an extension direction of the first fastening portion 132 is parallel to the first sliding track 120. When the buckle 231 is fastened with the fastening seat 131, the second fastening portion 232 is fitted in the first fastening portion 132 to fix the buckle 231 in the fastening seat 131. Moreover, the buckle 231 is slidable along a longitudinal direction of the fastening seat 131 in the fastening seat 131, and the second fastening portion 232 is also slidable along the longitudinal direction of the fastening seat 131 in the first fastening portion 132. Thus, when the buckle 231 is fastened with the fastening seat 131, the sliding fastener 200 is still allowed to move along the first sliding track 120 relative to the replaceable module 100. In addition, when the second sliding track 220 is connected to the first sliding track 120, the handle 230 can be pulled up to prevent the buckle 231 from interfering with the fastening seat 131 and hence prevent from obstructing the connection.

A pair of stroke blocks 240 are provided on the sliding fastener 200, and the operating surface 110 of the replaceable module 100 is provided with a positioning tongue 140 corresponding to the pair of stroke blocks 240. When the sliding fastener 200 moves along the first sliding track 120 relative to the replaceable module 100, the positioning tongue 140 is movable between the pair of stroke blocks 240 so as to limit a movable stroke of the sliding fastener 200. In this embodiment, one of the stroke blocks 240 is preferably a rib 241; however, the present invention is not limited thereto. More specifically, when the second sliding track 220 is connected to the first sliding track 120, the stroke block 240 that first comes into contact with the positioning tongue 140 is the rib 241, and the other stroke block 240 is a block wall. Accordingly, the positioning tongue 140 can cross over the rib 241 so as to move to a position between the two stroke blocks 240. The two stroke blocks 240 stop the positioning tongue 140 and one end of the first sliding track 120, respectively, so as to limit the movable stroke of the sliding fastener 200.

Figure 8:
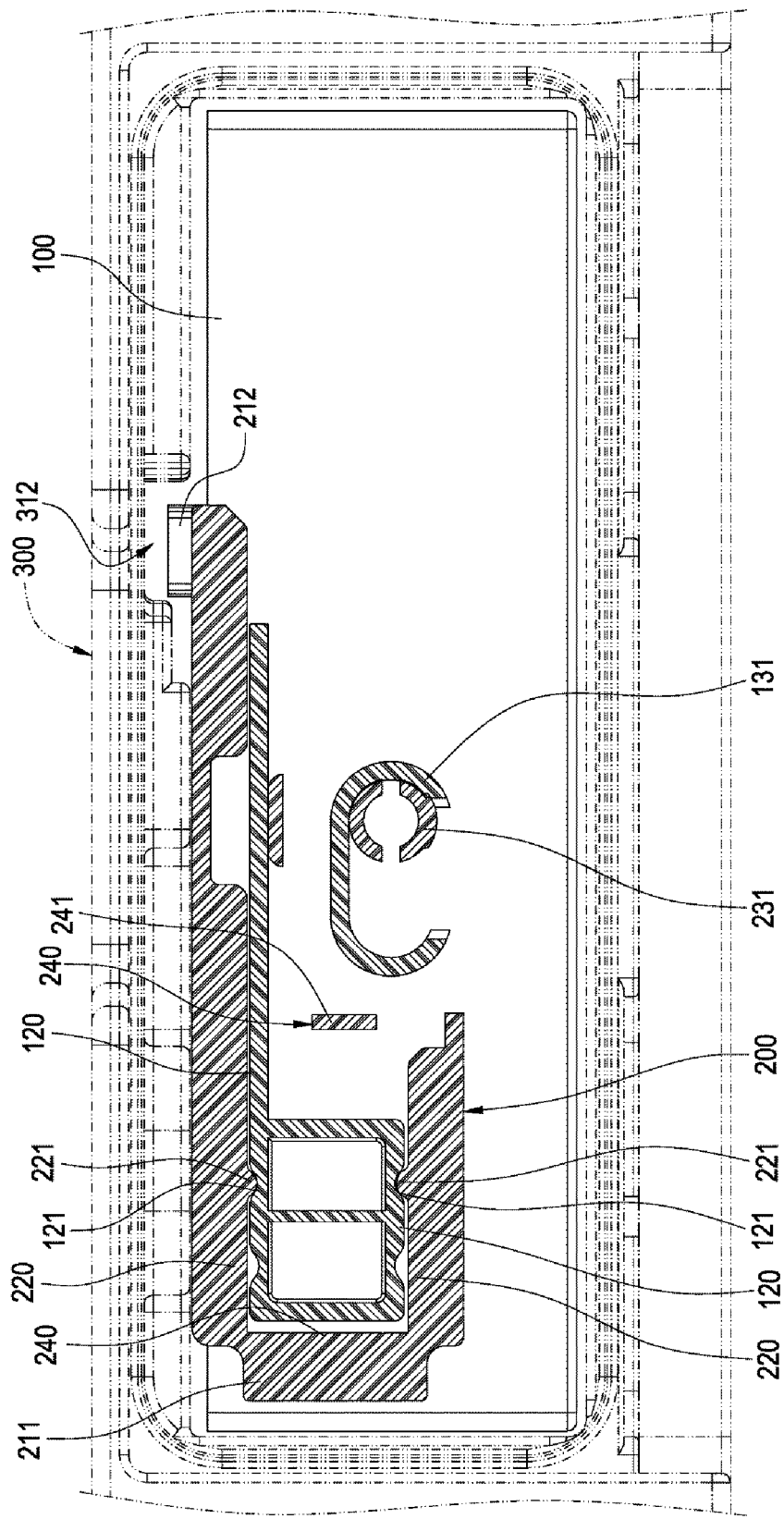
FIG. 8 is a cross-sectional diagram taken along a section line 8-8 in FIG. 7.
Figure 9:
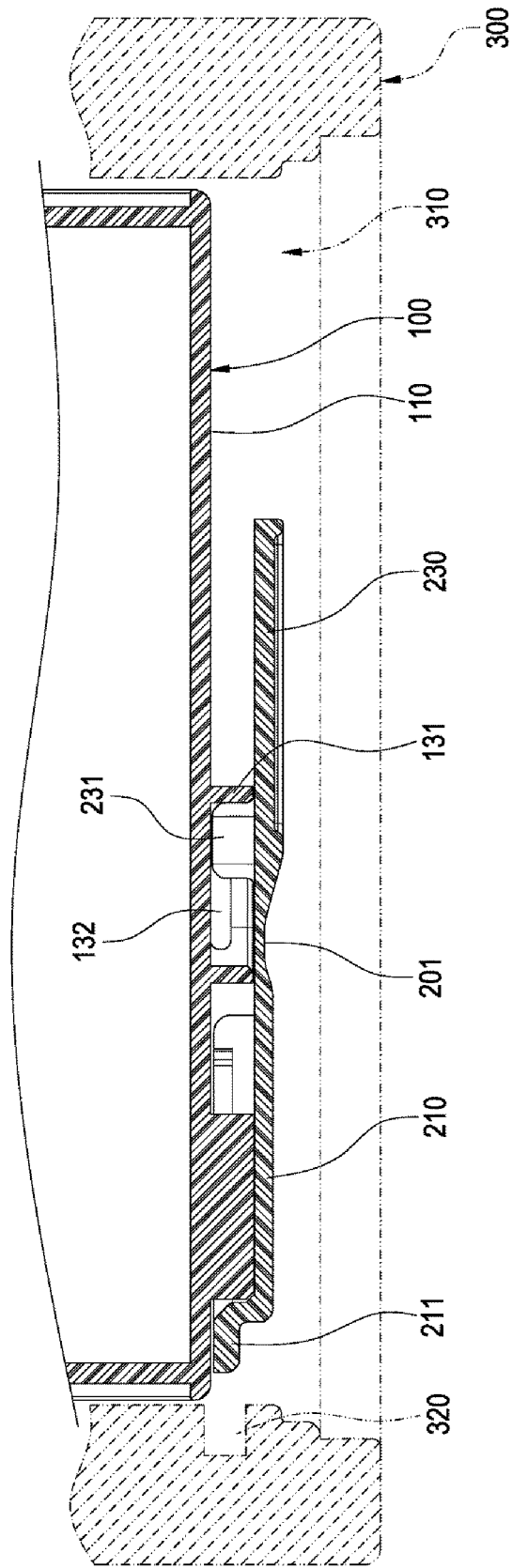
FIG. 9 is a cross-sectional diagram taken along a section line 9-9 in FIG. 7.
Figure 11:
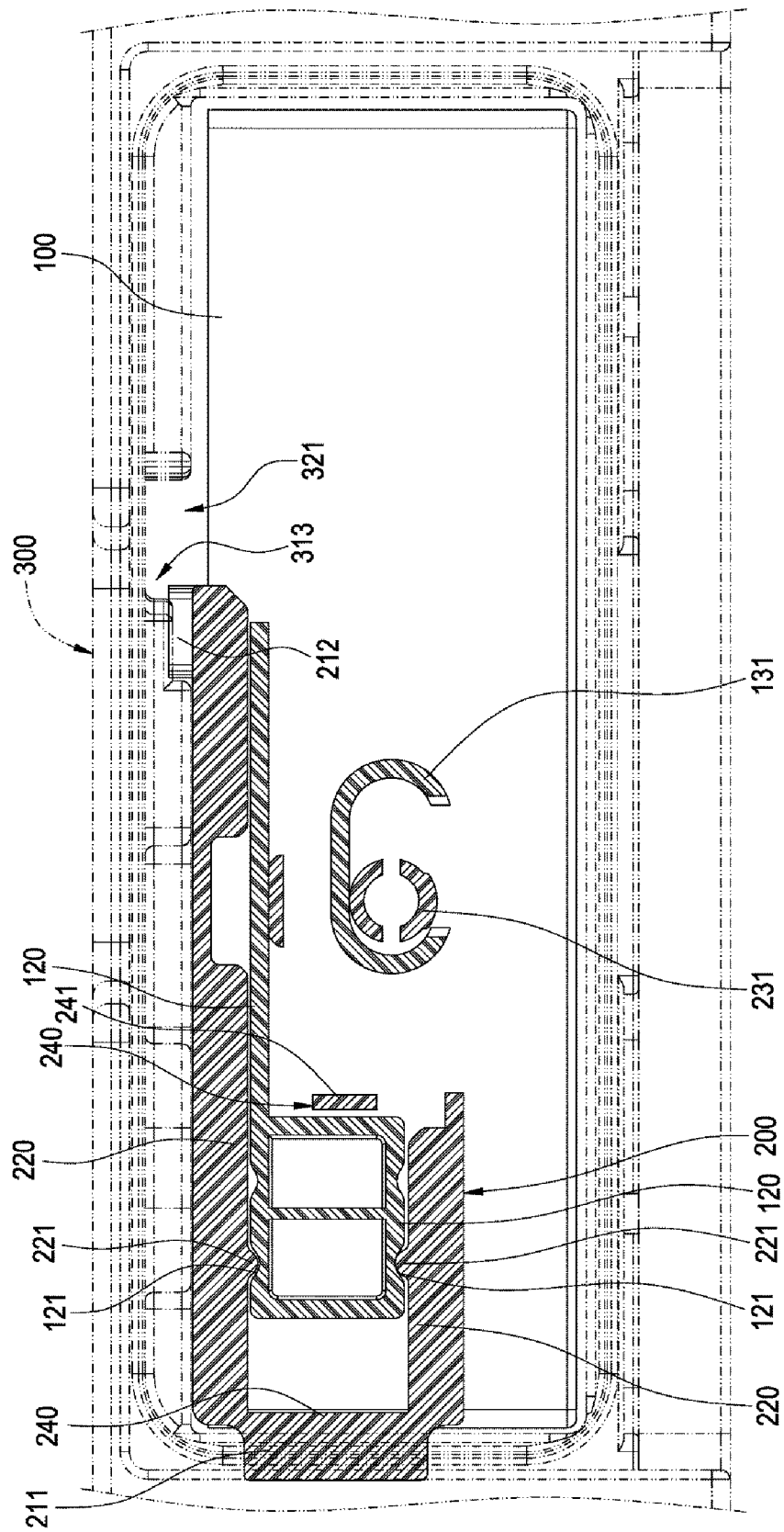
FIG. 11 is a cross-sectional diagram taken along a section line 11-11 in FIG. 10.
Figure 12:
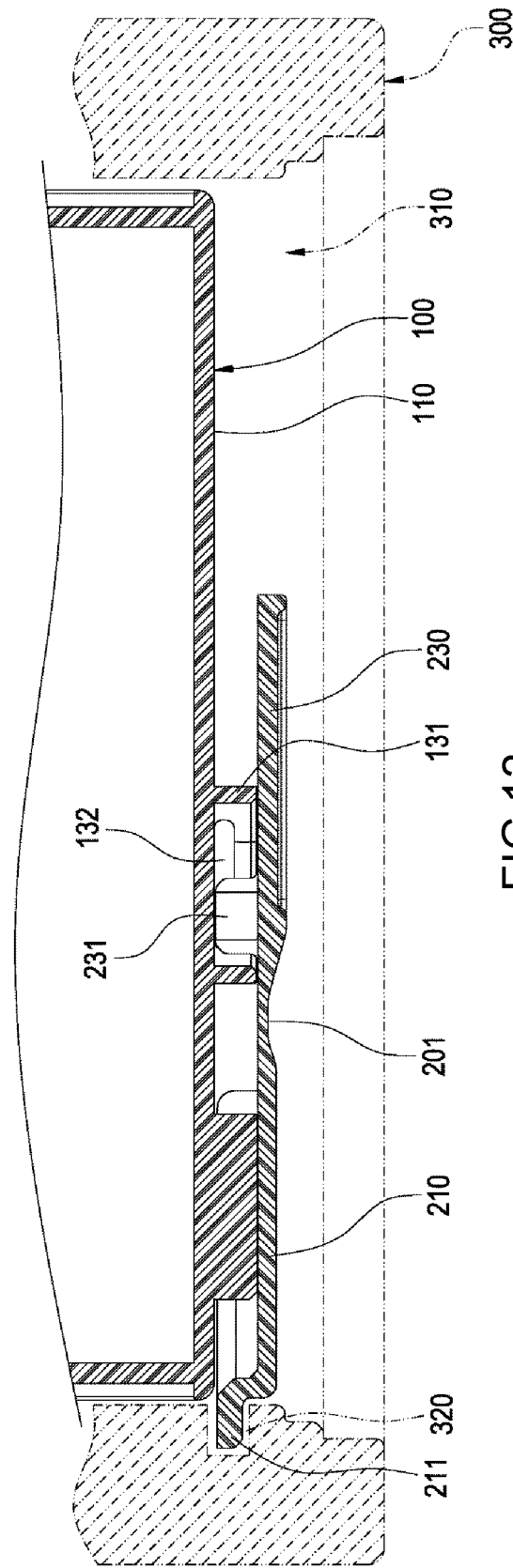
FIG. 12 is a cross-sectional diagram taken along a section line 12-12 in FIG. 10.

As shown in FIG. 1, FIG. 8 and FIG. 11, in this embodiment, the first sliding track 120 is provided with at least one positioning portion 121, and the correspondingly connected second sliding track 220 is correspondingly provided with at least one second positioning portion 221. The first positioning portion 121 and the second positioning portion 221 are a tongue and groove structure operable for mutual fitting. One of the first positioning portion 121 and the second positioning portion 221 is a tongue and the other is a groove. By mutually fitting the first positioning portion 121 and the second positioning portion 221, at least one specific position in the stroke of the sliding fastener 200 can be positioned.

Figure 6:
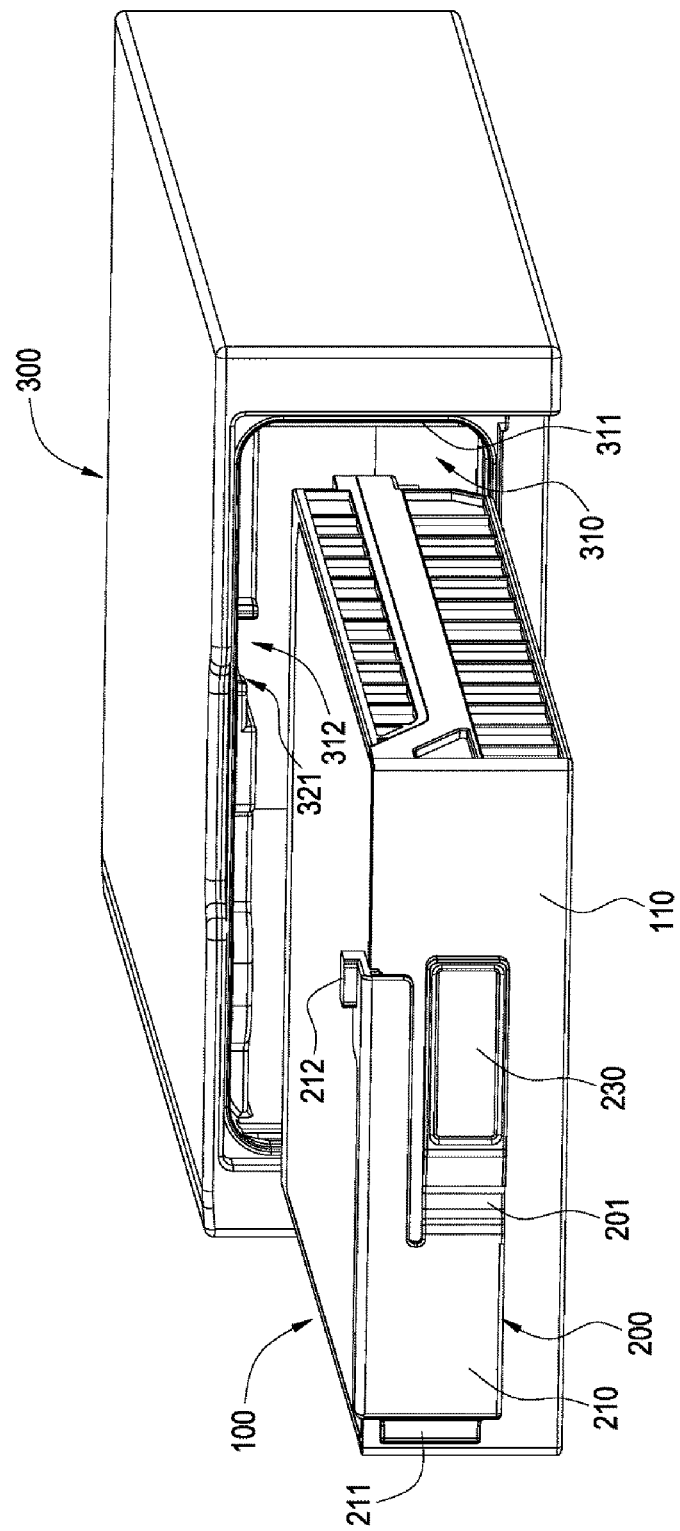
FIG. 6 and FIG. 7 are schematic diagrams of the installation of a replaceable module of an electronic device of the present invention.
Figure 7:
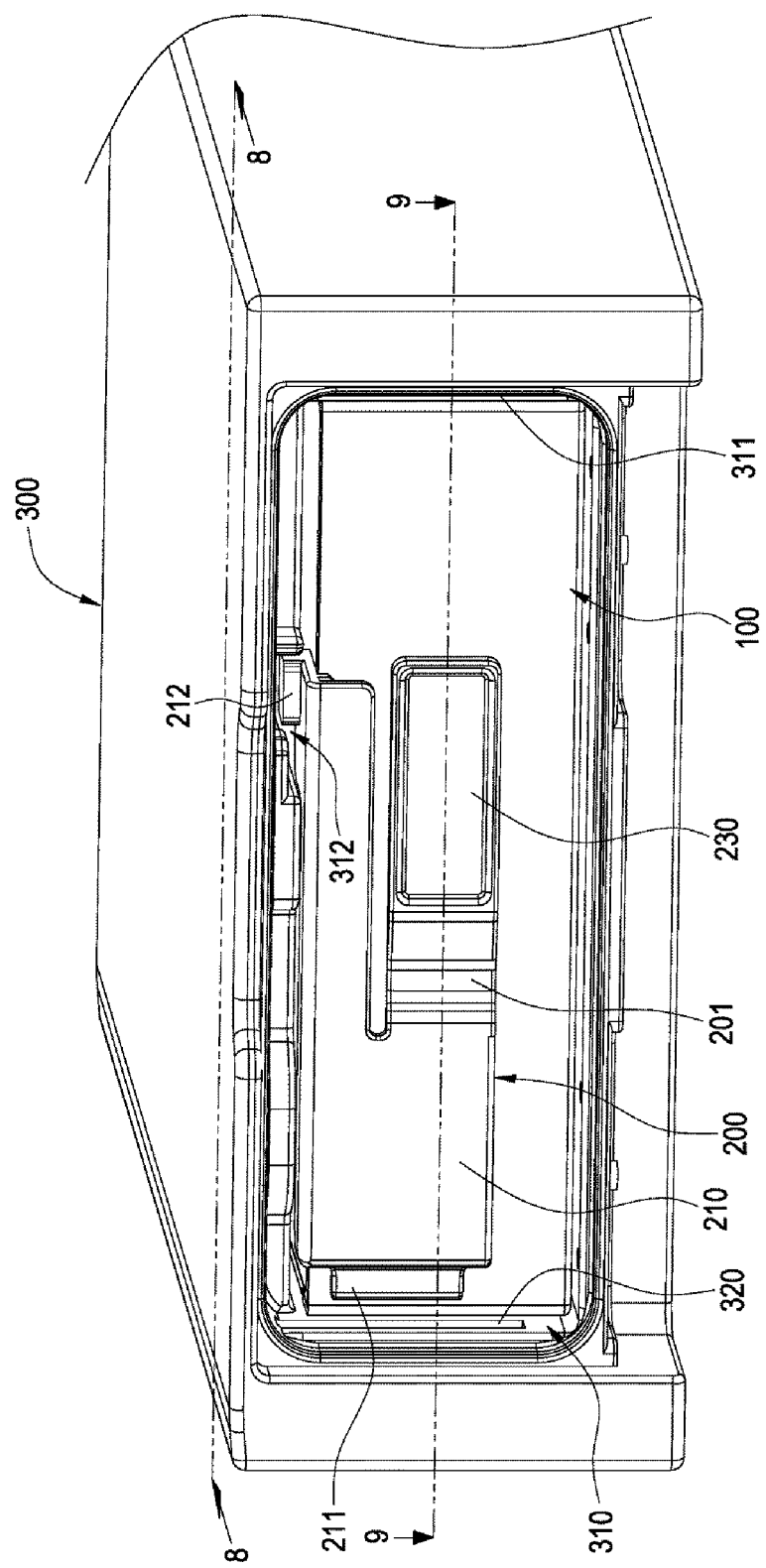
Figure 10:
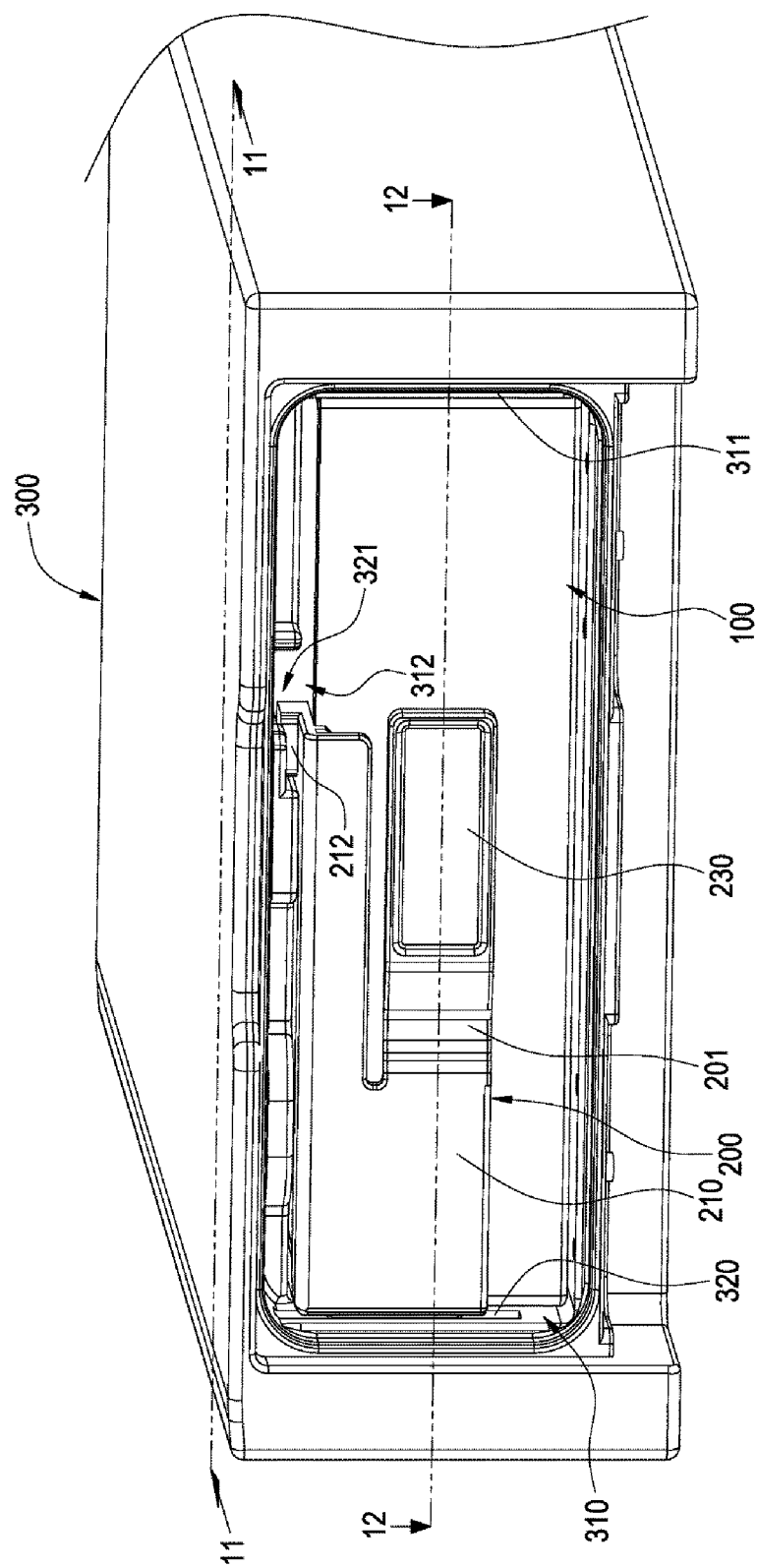
FIG. 10 is a schematic diagram of locking of a replaceable module of an electronic device of the present invention.

Referring to FIG. 1 to FIG. 3, FIG. 6 to FIG. 8, FIG. 10 and FIG. 11, a positioning latch 212 may be protrudingly provided on the other side of the body 210 to serve for assisting in locking and positioning. A corresponding auxiliary latch slot 321 is provided on an inner edge of the other side of the opening 311 of the accommodation chamber 310. The auxiliary latch slot 321 extends in parallel to the inner edge of the opening 311, and the auxiliary latch slot 321 and the opening 311 are connected with each other by a passage 312 in between. An extension direction of the passage 312 is parallel to the direction in which the replaceable module 100 is inserted into the accommodation chamber 310, and the positioning latch 212 protrudes from the replaceable module 100 regardless of the position of the sliding fastener 200 in the movement stroke thereof, such that the positioning latch 212 interferes with the opening 311 when the replaceable module 100 is inserted into the accommodation chamber 310. As shown in FIG. 6 to FIG. 8, when the replaceable module 100 is inserted into the accommodation chamber 310, the positioning latch 212 is aligned with the passage 312 in order to be allowed to enter the passage 312 so as to completely insert the replaceable module 100 into the accommodation chamber 310, otherwise the positioning latch 212 interferes with the inner edge of the opening 311 in a way that the replaceable module 100 cannot be completely inserted into the accommodation chamber 310. As the positioning latch 212 interferes with the opening 311, the replaceable module 100 is prevented from being placed in reverse and further inserted into the accommodation chamber 310, hence preventing damage of an electrical connector. As shown in FIG. 10 and FIG. 11, once the replacement module 100 is inserted into the accommodation chamber 310, the sliding fastener 200 is moved along the first sliding track 120 to further latch the latch 211 and the positioning latch 212 into the latch slot 320 and the auxiliary latch slot 321, respectively, so as to prevent the replaceable module 100 from disengaging from the accommodation chamber 310.

Referring to FIG. 1 to FIG. 3, FIG. 6, FIG. 7 and FIG. 14, a withdrawal method for the replaceable module 100 includes the following steps.

First of all, in step (a), a replaceable module 100 is provided. As shown in FIG. 1, a first sliding track 120 is provided on one side of the replaceable module 100. Moreover, as shown in FIG. 6 and FIG. 7, the replaceable module 100 is accommodated in a host body 300.

In step (b) following step (a), a sliding fastener 200 is provided. As shown in FIG. 2, the sliding fastener 200 includes a body 210, the body 210 is provided with a second sliding track 220 and a latch 211, and a handle 230 is extended from the body 210. A groove 201 is traversely disposed at a joint between the body 210 and the handle 230. The sliding fastener 200 is elastically bendable along the groove 201 to enable the handle 230 to turn along the groove 201 relative to the body 210. As shown in FIG. 1, the sliding fastener 200 includes a buckle 231, and the replaceable module 100 is correspondingly provided with a fastening seat 131. The sliding fastener 200 is provided with a pair of stroke blocks 240, the replacement module 100 is provided with a positioning tongue 140 corresponding to the pair of stroke blocks 240, and one of the pair of stroke blocks 240 is a rib 241. As shown in FIG. 1 and FIG. 3, the second sliding track 220 is connected to the first sliding track 120. When the second sliding track 220 is connected to the first sliding track 120, the stroke block 240 that first comes into contact with the positioning tongue 140 is the rib 241, and the other stroke block 240 is a block wall. Accordingly, the positioning tongue 140 can cross over the rib 241 so as to move to a position between the two stroke blocks 240.

Figure 4:
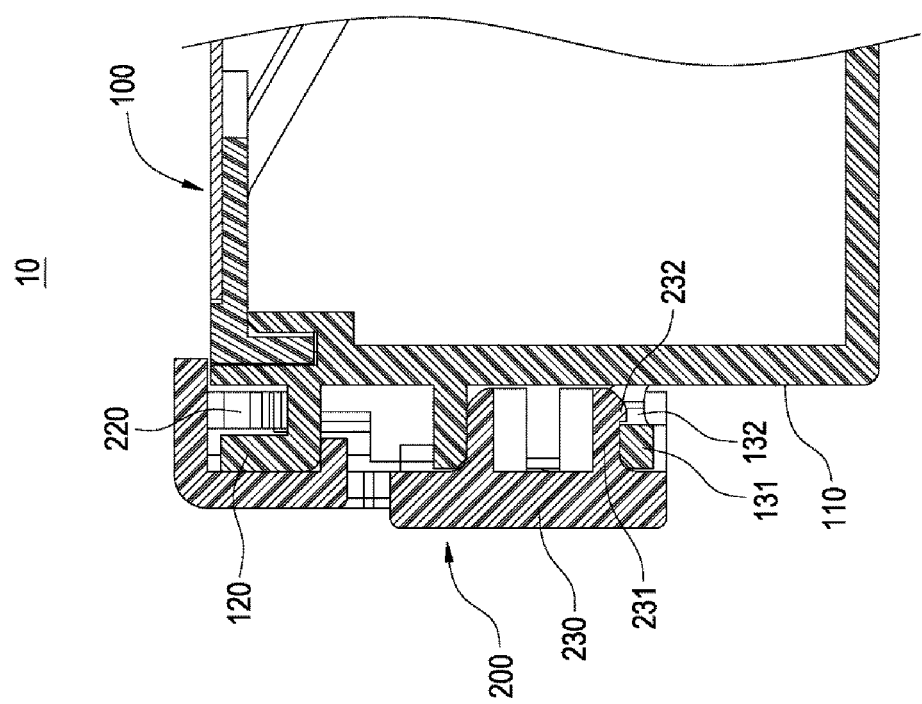
FIG. 4 is a cross-sectional diagram taken along a section line 4-4 in FIG. 3.
Figure 5:
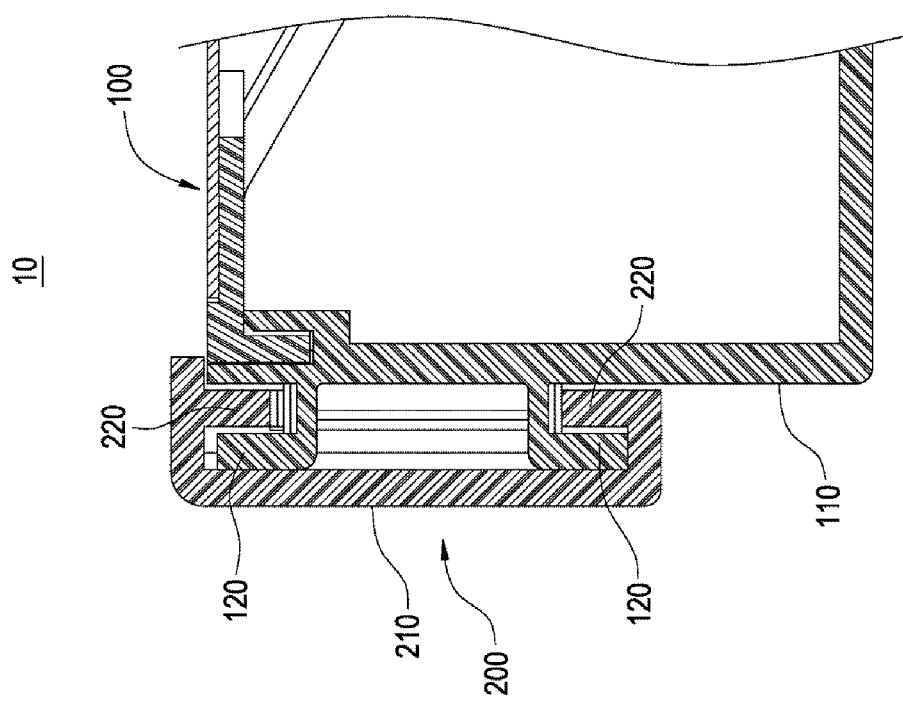
FIG. 5 is a cross-sectional diagram taken along a section line 5-5 in FIG. 3.

Referring to FIG. 3 to FIG. 5, in step (c) following step (b), the second sliding track 220 is connected to the first sliding track 120, such that the handle 230 is enabled to turn along the groove 201 so as to be adhered to or erected on the operating surface 110 of the replaceable module 100. The sliding fastener 200 is pushed and moved along the first sliding track 120 to move the positioning tongue 140 to a position between the pair of stroke blocks 240 so as to limit the movable stroke of the sliding fastener 200. Moreover, the positioning tongue 140 crosses over the rib 241 and moves to a position between the pair of stroke blocks 240. Referring to FIG. 6 to FIG. 12, the sliding fastener 200 is movable along the first sliding track 120 relative to the replaceable module 100 to insert the latch 211 into the host body 300, so as to lock the replaceable module 100 in the host body 300. When the handle 230 is adhered to the operating surface 110 of the replaceable module 100, the handle 230 is adhered to the operating surface 110 of the replacement module 100, and the buckle 231 is fastened with the fastening seat 131 so as to fix the handle 230 to the operating surface 110 of the replaceable module 100.

Referring to FIG. 6 to FIG. 9 and FIG. 13, in step (d), the handle 230 is erected on the operating surface 110 of the replaceable module 100, and the handle 230 is pulled to move the replaceable module 100 out of the host body 300. The handle 230 is erected on the operating surface 110 of the replaceable module 100, and the handle 230 is pulled along a longitudinal direction of the handle 230 to drag and move the replaceable module 100.

Figure 13:
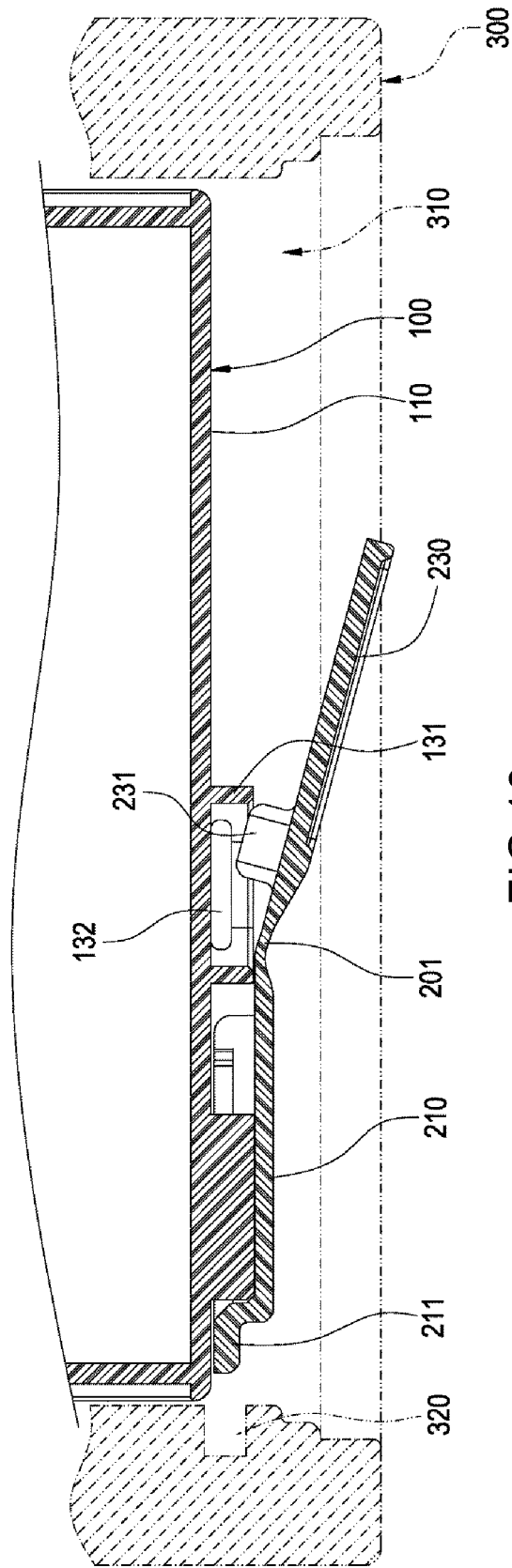
FIG. 13 is a schematic diagram of a state of use of a handle of a sliding fastener of an electronic device of the present invention.
Figure 14:
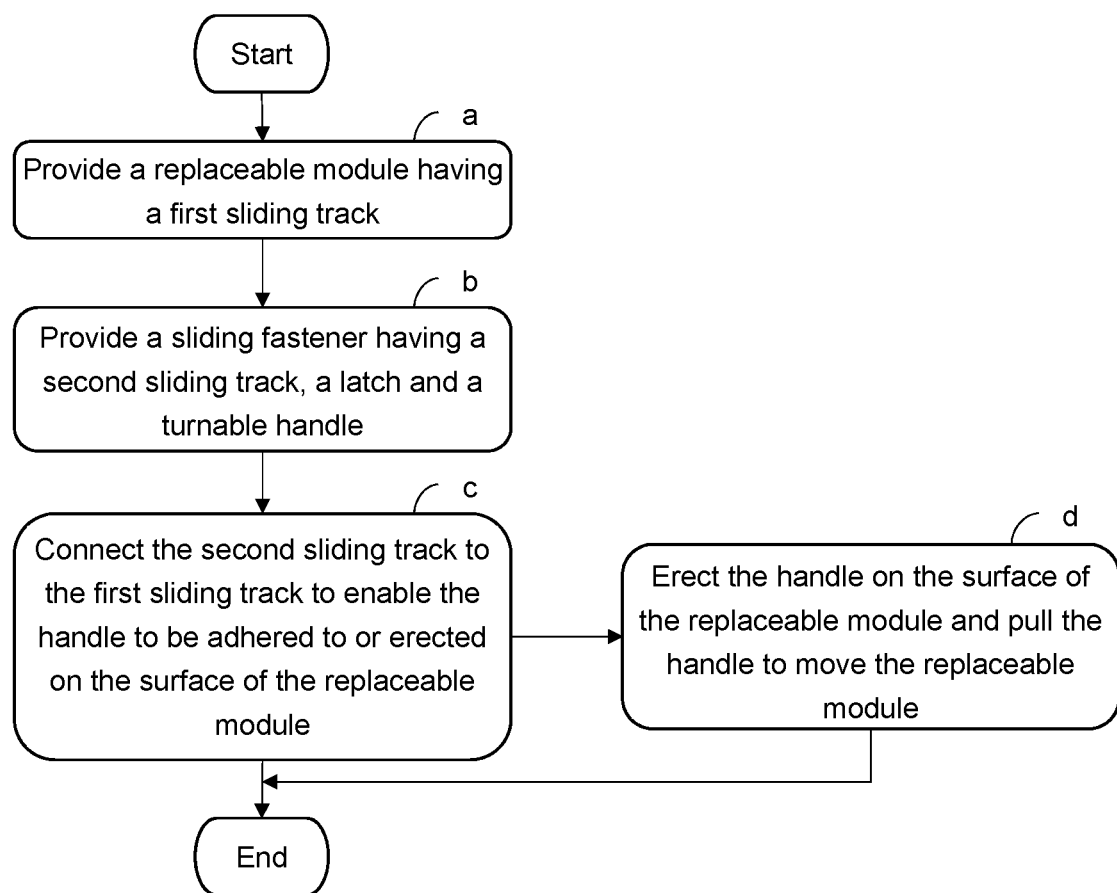
FIG. 14 is a flowchart of a withdrawal method for a replaceable module of the present invention.

In addition, the handle 230 may also be erected on the operating surface 110 of the replaceable module 100 for a user to pull the handle 230 in a direction parallel to the first sliding track 120, thereby pushing and moving the sliding fastener 200 along the first sliding track 120. In this embodiment, the latch 211 and the handle 230 extend in a back-to-back manner. Thus, as shown in FIG. 13, when the handle 230 is pulled up, the sliding fastener 200 is also pulled along to withdraw the latch 211 from the latch slot 320 and the replaceable module 100 is further pulled out of the host body 300.

In conclusion, in the electronic device 10 of the present invention, the sliding fastener 200 is provided on the replaceable module 100 to form a replaceable module 100 having a bendable handle 230. Thus, the handle 230 may be bent and turned so as to be erected on the operating surface 110 of the replaceable module 100 for a user to pull the replaceable module 100 out of the electronic device 10. Moreover, the handle 230 is formed on the sliding fastener 200 and is thus easily stored and secured.

The preferred embodiments of the present invention are described as above, and are not to be construed as limitations to the present invention. Other equivalent variations based on the inventive spirit of the present invention are to be encompassed within the scope of the claims of the present invention.

What is claimed is:

1. An electronic device, comprising:
    a replaceable module, provided with a first sliding track; and
    a sliding fastener, comprising a body, wherein a latch is extended from the body and a groove is provided to form a handle, the body is provided with a second sliding track corresponding to the first sliding track, and the handle is elastically bendable along the groove so as to flex relative to the body and disengage from the replaceable module;
    wherein the second sliding track is interlocked with the first sliding track, and the sliding fastener is slidable along the first sliding track relative to the replaceable module.

2. The electronic device according to claim 1, further comprising:
    a host body, provided with an accommodation chamber and a latch slot, wherein a direction in which the replaceable module is inserted into the accommodation chamber is perpendicular to a direction in which the latch is inserted into the latch slot.

3. The electronic device according to claim 2, wherein the accommodation chamber has an opening and the replaceable module enters the accommodation chamber through the opening, a positioning latch is protrudingly provided on one side of the body and a corresponding passage is provided on one side of the opening, the positioning latch interferes with an inner edge of the opening, the passage is connected with the opening, an extension direction of the passage is parallel to the direction in which the replaceable module is inserted into the accommodation chamber, and when the positioning latch is aligned with the passage, the positioning latch is capable of inserting into the passage to completely insert the replaceable module into the accommodation chamber.

4. The electronic device according to claim 3, wherein the host body is provided with an auxiliary latch slot connected with the passage, the auxiliary latch slot extends in parallel to the inner edge of the opening, and once the replaceable module is inserted into the accommodation chamber, the latch and the positioning latch are respectively latched into the latch slot and the auxiliary latch slot by moving the sliding fastener along the first sliding track.

5. A sliding fastener, comprising a body, wherein a latch is extended from the body and a groove is provided to form a handle, and the handle is elastically bendable along the groove so as to flex relative to the body, wherein the groove is disposed at a joint between the body and the handle, a thickness of the joint measured in a first direction is less than a thickness of the body measured in the first direction and less than a thickness of the handle measured in the first direction.

6. The sliding fastener according to claim 5, wherein the handle is provided with a buckle.

7. The sliding fastener according to claim 5, further comprising a pair of stroke blocks provided on the body.

8. The sliding fastener according to claim 7, wherein one of the pair of stroke blocks is a rib.

9. The sliding fastener according to claim 5, wherein surfaces of the body and the handle opposite to the groove are co-planar when the sliding fastener is in an unflexed state, and non-coplanar when the sliding fastener is in a flexed state.

10. The sliding fastener according to claim 5, wherein a relative position between the latch and the body is the same regardless of whether the sliding fastener is in a flexed state or an unflexed state.

11. The sliding fastener according to claim 5, wherein the sliding fastener comprises a stroke block between the latch and the handle.

12. The sliding fastener according to claim 5, wherein the handle is provided with a buckle and a portion of the body is between the buckle and the latch.

* * * * *